United States Patent
Kang et al.

(10) Patent No.: US 10,664,633 B2
(45) Date of Patent: May 26, 2020

(54) WELLBORE THERMAL, PRESSURE, AND STRESS ANALYSIS ABOVE END OF OPERATING STRING

(71) Applicant: Landmark Graphics Corporation, Houston, TX (US)

(72) Inventors: Yongfeng Kang, Katy, TX (US);
Adolfo Gonzales, Houston, TX (US);
Jun Jiang, Austin, TX (US);
Zhengchun Liu, Sugar Land, TX (US);
Robello Samuel, Cypress, TX (US)

(73) Assignee: Landmark Graphics Corporation, Houston, TX (US)

( * ) Notice: Subject to any disclaimer, the term of this patent is extended or adjusted under 35 U.S.C. 154(b) by 161 days.

(21) Appl. No.: 15/285,551

(22) Filed: Oct. 5, 2016

(65) Prior Publication Data
US 2018/0096083 A1  Apr. 5, 2018

(51) Int. Cl.
| | | |
|---|---|---|
| *G06F 30/20* | (2020.01) | |
| *E21B 47/00* | (2012.01) | |
| *E21B 33/12* | (2006.01) | |
| *E21B 41/00* | (2006.01) | |
| *E21B 43/16* | (2006.01) | |
| *E21B 43/26* | (2006.01) | |

(52) U.S. Cl.
CPC .............. *G06F 30/20* (2020.01); *E21B 33/12* (2013.01); *E21B 41/0092* (2013.01); *E21B 43/16* (2013.01); *E21B 43/26* (2013.01); *E21B 47/0006* (2013.01)

(58) Field of Classification Search
CPC .. G06F 17/5009; E21B 33/12; E21B 41/0092; E21B 43/16; E21B 43/26; E21B 47/0006
USPC .......................................................... 703/10
See application file for complete search history.

(56) References Cited

U.S. PATENT DOCUMENTS

| | | | |
|---|---|---|---|
| 5,036,919 A | 8/1991 | Thomas et al. | |
| 5,103,913 A | 4/1992 | Nimerick et al. | |
| 5,265,678 A * | 11/1993 | Grundmann | ............ E21B 43/26 166/308.1 |
| 5,894,888 A | 4/1999 | Wiemers et al. | |
| 7,243,723 B2 | 7/2007 | Surjaatmadja et al. | |
| 7,401,652 B2 | 7/2008 | Matthews | |
| 8,983,819 B2 | 3/2015 | Jiang et al. | |
| 9,074,459 B2 | 7/2015 | Mitchell et al. | |
| 2008/0262802 A1* | 10/2008 | Halabe | .................... E21B 43/00 703/1 |
| 2010/0006293 A1 | 1/2010 | Gu et al. | |
| 2013/0306315 A1 | 11/2013 | Kaminsky et al. | |
| 2014/0034390 A1* | 2/2014 | Mitchell | .................. G06G 7/56 175/57 |

(Continued)

OTHER PUBLICATIONS

Ali_2014 (Transient Temperature modeling for wellbore fluid under static and dynamic conditions, Texas, A&M University, May 2014). (Year: 2014).*

(Continued)

*Primary Examiner* — Brian S Cook
(74) *Attorney, Agent, or Firm* — Haynes and Boone, LLP

(57) ABSTRACT

A system provides thermal and stress analysis of complex well operations above the end of the downhole string to meet the analysis needs of downhole operations such as hydraulic fracturing in unconventional oil and gas field development.

11 Claims, 15 Drawing Sheets

(56) References Cited

U.S. PATENT DOCUMENTS

2017/0051598 A1* 2/2017 Ouenes .................. E21B 43/26

OTHER PUBLICATIONS

Feng, et al., "Multiple-Stage Fracture Treatment of Horizontal Wells," *Society of Petroleum Engineers 2006 International Oil & Gas Conference and Exhibition*, Dec. 5-7, 2006, Beijing, China.
Jinzhou, et al., "China Developing Strategy for Horizontal Fracturing Technology," *Oil & Gas Journal*, Jul. 1, 2013, vol. 111, Issue 7.
Kennedy, et al., "Optimized Shale Resource Development: Proper Placement of Wells and Hydraulic Fracture Stages," *Society of Petroleum Engineers Abu Dhabi International Petroleum Exhibition and Conference*, Nov. 11-14, 2012, Abu Dhabi, United Arab Emirates.
International Search Report and the Written Opinion of the International Search Authority, or the Declaration, dated Dec. 22, 2017, PCT/US2017/051113, 10 pages, ISA/KR.

\* cited by examiner

Fig. 4

WELLBORE THERMAL, PRESSURE, AND STRESS ANALYSIS ABOVE END OF OPERATING STRING

FIELD OF THE DISCLOSURE

The present disclosure relates generally to downhole simulators and, more specifically, to a simulation of wellbore thermal, pressure, and stress analysis above the end of the operating string during complex well operations.

BACKGROUND

The existence of trapped annular pressure and wellhead movement caused by downhole temperatures and stresses is known in the industry. In conventional well planning and completion design, engineers are challenged by well operations conducted above the end of the operating string (e.g., a workstring, tubing, etc.), which require accurate thermal, pressure, and stress estimation, especially in stage-by-stage hydraulic fracturing operations. In such operations, the scenarios become complex due to the use of plugs in the string, as well as packers in the annulus, at the operation depth (e.g., fracturing, injection perforation, or circulation depth), which result in isolated regions inside the string and/or in the annulus spaces. The wellbore components (fluids, casing, tubing, cements, etc.) have different thermal and stress responses in the regions above and below the plug and packers.

To date, however, conventional analysis techniques have only considered the thermal and stress responses below the end of the string, while failing to consider the thermal and stress responses above the end of the string. Therefore, current attempts have failed to provide the most accurate data for the complicated thermal, pressure, and stress behaviors on the wellbore and strings necessary for accurate and optimal tubular and completion designs, especially when there are a sequence of multiple operations performed step-by-step at different depths.

BRIEF DESCRIPTION OF THE DRAWINGS

FIG. 4 illustrates a user interface (GUI) 400 used to define thermal and stress related parameters, according to certain illustrative embodiments of the present disclosure;

DESCRIPTION OF ILLUSTRATIVE EMBODIMENTS

Figure 1A:
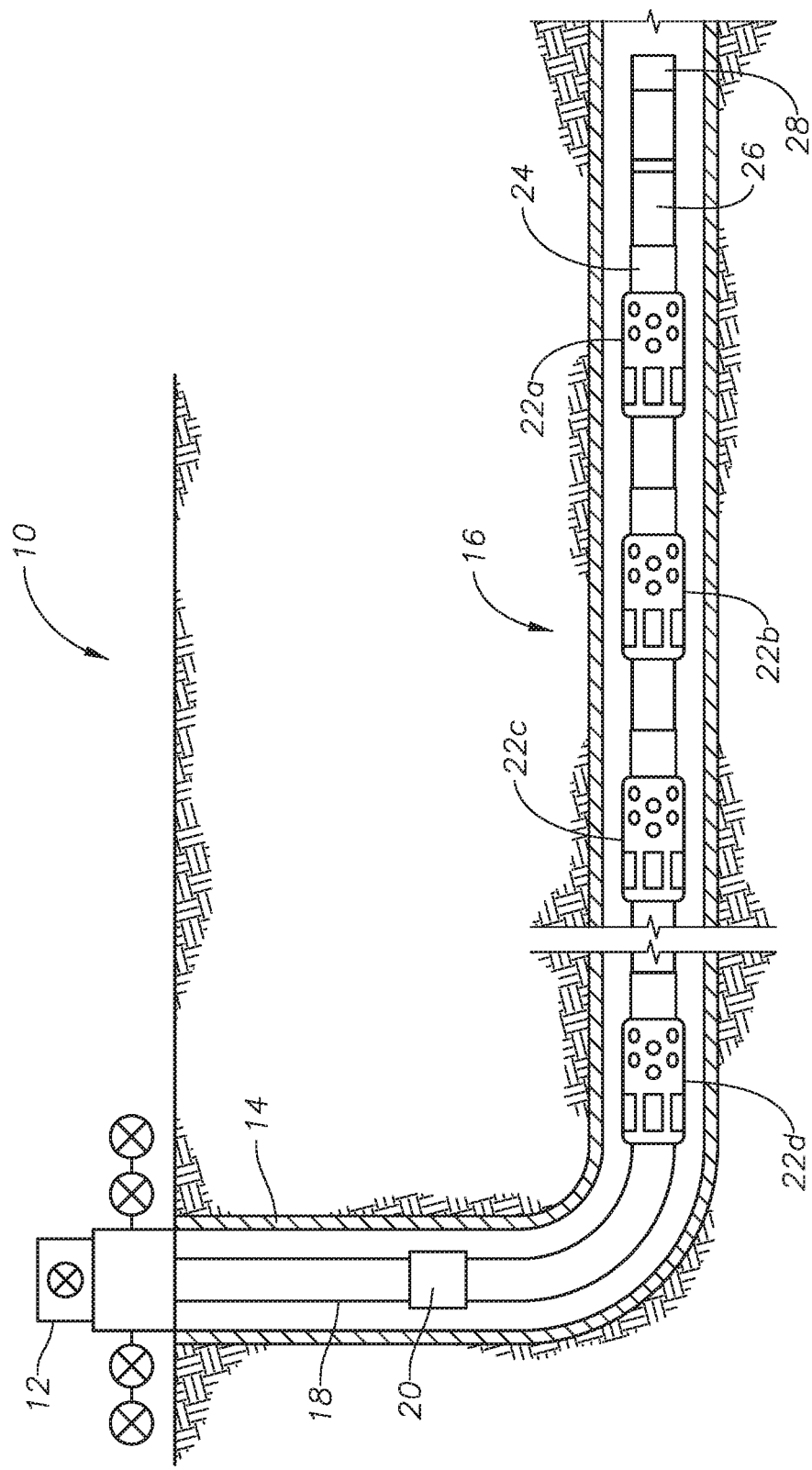
FIGS. 1A and 1B illustrate a stage-by-stage fracture operation for a horizontal well hydraulic fracture procedure

Illustrative embodiments and related methods of the present disclosure are described below as they might be employed in a methods of simulating thermal and stress conditions of a wellbore above an end of the operating string. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, illustrative methods and embodiments of the present disclosure simulate thermal and stress conditions of a wellbore above the end of the operating string. In the example of a drilling assembly, the "end of the operating string" is the drill bit; therefore, all portions of the operating string above the drill bit is considered as being above the end of the string. In the example of a fracturing assembly, the area above the shoe would be considered above the end of the operating string. In a generalized method of the present disclosure, the simulation begins by defining a wellbore configuration having an operating string therein. A downhole operation is then defined along the wellbore above the end of the operating string (e.g., fracture or injection operation). Thereafter, based upon the wellbore configuration and operation to be performed, the thermal and stress response of the wellbore above the end of the operating string is calculated. Wellhead movement and/or trapped annular pressure buildup of the wellbore may then be determined. As a result of this analysis, an optimal downhole operation or wellbore design may be analyzed or determined.

The present disclosure provides integrated methods and systems for wellbore thermal and stress analysis during complex well operations above the end of the string involving a sequence of events that require modeling tubing and annulus fluids, temperature, and pressure conditions in isolated intervals defined by multiple plugs, packers, and the stress state of the completion. As will be described below, the wellbore thermal and stress simulator includes the following core functionalities: inventories of fluids and properties, pipes and mechanical properties, formation and soil properties, string grade properties, cements and properties, connections, etc.; wellbore configuration; fluid properties; flowing conditions; flow patterns; transient/steady state thermal analysis; pressure and temperature profiles; stresses; forces; safety factor; movement analysis; and trapped annular pressure analysis. In addition, illustrative embodiments and methods of the present disclosure further provide thermal and stress calculations for above end of string operations to meet the analysis needs of these operation types such as, for example, hydraulic fracturing in unconventional oil and gas field development.

Furthermore, the present disclosure allows the engineer to define such operations anywhere above the end of string and calculate the wellbore thermal and stress response. The operation could be, for example, fracturing, injection, production or circulation. The present disclosure also allows the engineer to define a sequence of linked operations involving the above end of string operation, in which the results of a prior operation are applied as the initial condition of the next operation to accurately simulate the actual operations procedure, such as a stage-by-stage hydraulic fracturing procedure.

Figure 1B:
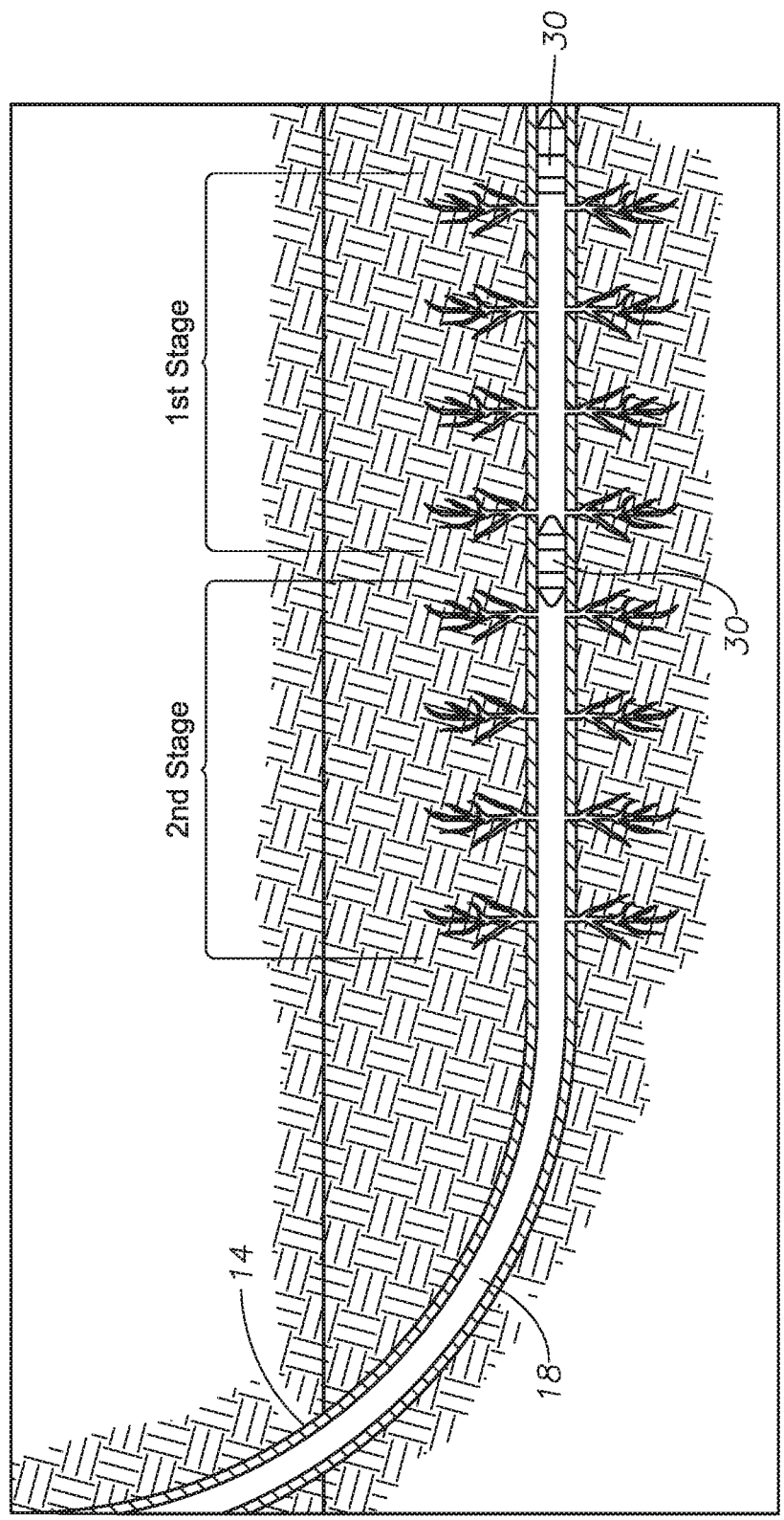

FIGS. 1A and 1B illustrate a stage-by-stage fracture operation for a horizontal well hydraulic fracture procedure. In FIG. 1A, a fracturing system 10 is shown having a blowout preventer 12 positioned atop a borehole 14 extending along a hydrocarbon formation. An operating string 16 is positioned along borehole 14 comprised of tubing 18, safety joint 20, a series of sliding sleeve perforation tools/stages 22a-d, check valve 24, liner 26, and shoe guide 28. In the horizontal well hydraulic fracture operation illustrated in FIG. 1A, the fractures are performed stage-by-stage from the toe of borehole 14 to the heel of the horizontal well section. With reference to FIG. 1B, once one stage is completed (e.g., first stage 22a), a plug 30 is installed in tubing 18 (above first stage 22a) to do the next stage (e.g., second stage 22b) of fracturing. This process is repeated until all the stages are complete. Note that FIG. 1B is shown in simplified form, thus it does not show the fracturing assembly along tubing 18 (as shown in FIG. 1A). During the fracture operation, the fluids, casing, tubing, cements, etc., all have different thermal and stress responses in the regions above and below plug 30 and the packers (not shown). The present disclosure provides methods to analyze the complicated thermal, pressure and stress behavior on the wellbore and the strings, thereby allowing the development of optimal completion designs.

Figure 2:
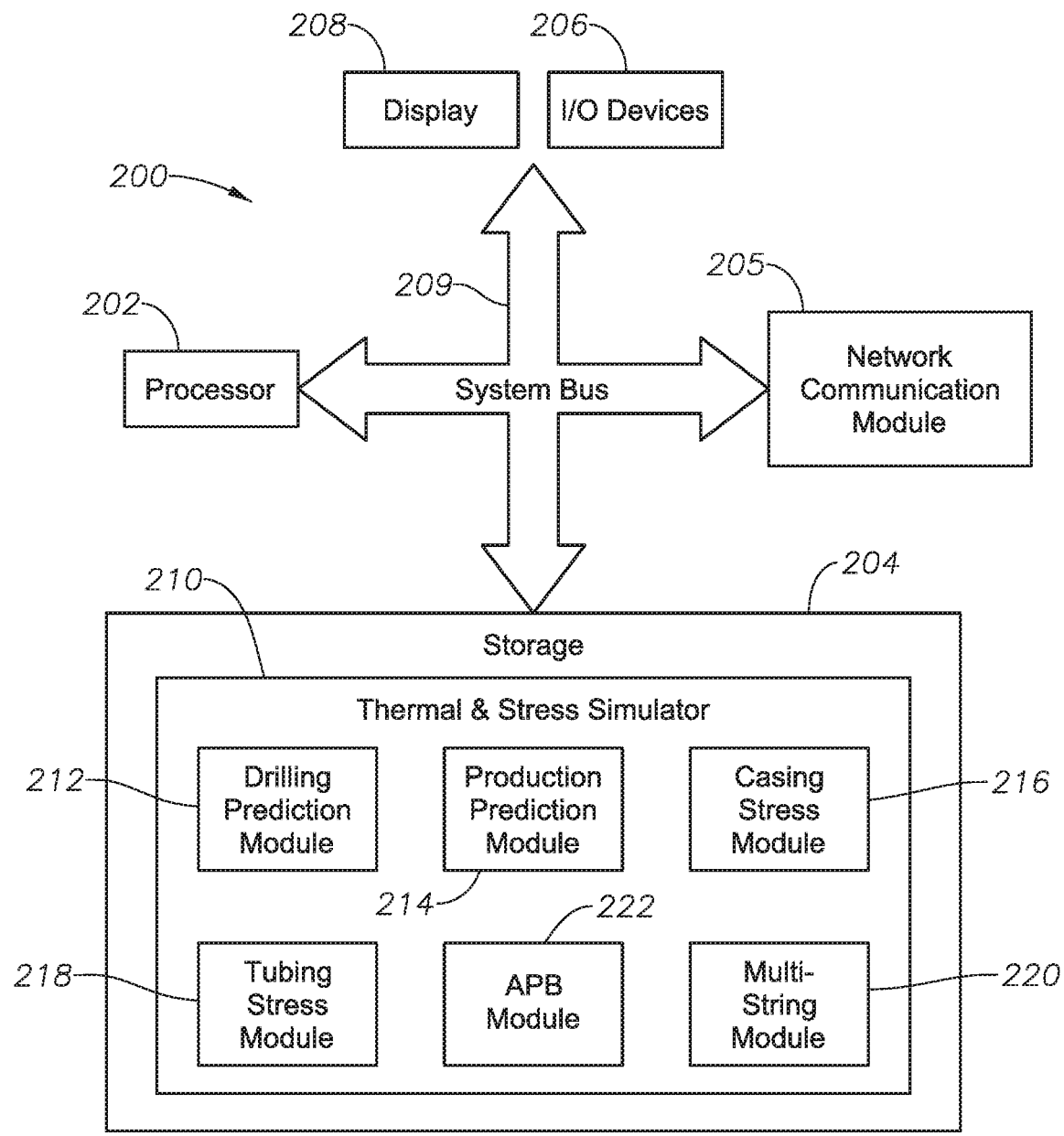
FIG. 2 shows a block diagram of downhole thermal and stress simulation system according to an illustrative embodiment of the present disclosure.

FIG. 2 shows a block diagram of downhole thermal and stress simulation system 200 according to an illustrative embodiment of the present disclosure. In one embodiment, thermal and stress simulation system 200 includes at least one processor 202, a non-transitory, computer-readable storage 204, transceiver/network communication module 205, optional I/O devices 206, and an optional display 208, all interconnected via a system bus 209. Software instructions executable by the processor 202 for implementing software instructions stored within thermal and stress simulation system 200 in accordance with the illustrative embodiments described herein, may be stored in storage 204 or some other computer-readable medium.

Although not explicitly shown in FIG. 2, it will be recognized that thermal and stress simulation system 200 may be connected to one or more public and/or private networks via appropriate network connections. It will also be recognized that the software instructions comprising thermal and stress simulator 210 may also be loaded into storage 204 from a CD-ROM or other appropriate storage media via wired or wireless means.

FIG. 2 further illustrates a block diagram of thermal and stress simulator 210 according to an illustrative embodiment of the present disclosure. As will be described below, thermal and stress simulator 210 comprises drilling prediction module 212, production prediction module 214, casing stress module 216, tubing stress module 218, multi-string module 220, and an annular pressure buildup ("APB") module 222. Based upon the input variables as described below, the algorithms of the various modules combine to provide the downhole thermal and stress analysis of the present disclosure above and below the end of the operating string.

Drilling prediction module 212 simulates, or models, drilling events and the associated well characteristics such as the drilling temperature and pressure conditions present downhole during logging, trip pipe, casing, and cementing operations, above and below the end of the operating string. Production prediction module 214 models production events and the associated well characteristics such as the production temperature and pressure conditions present downhole during circulation, production, injection, gas lift and shut in operations above and below the end of the operating string. Casing stress module 216 models the stresses caused by changes from the initial to final loads on the casing, as well as the temperature and pressure conditions affecting the casing.

Tubing stress module 218 simulates the stresses caused by changes from the initial to final loads on the tubing, as well as the temperature and pressure conditions affecting the tubing above and below the end of the operating string. The modeled data received from the foregoing modules is then fed into APB module 222 which analyzes the annulus fluid expansion ("AFE") and trapped annulus pressure buildup ("APB") of the final conditions from the initial conditions. Thereafter, the data modeled in APB module 222 is then fed into multi-string module 220, which models wellhead movement of the wellbore system with operations of both above and below the end of the operating string. APB data modeled from APB module 222 is also fed into multi-string module 220 for further stress and safety factors calculation for each string. Persons ordinarily skilled in the art having the benefit of this disclosure realize there are a variety modeling algorithms that could be employed to achieve the results of the foregoing modules.

In view of the foregoing, thermal and stress simulation system 200 is comprised of two primary components and their associated functions: a Graphical User Interface ("GUI") (e.g., display 208) and the calculation engines provided by thermal and stress simulator 210. In certain illustrative embodiments, the GUI provides various functions. First, via the GUI, the formation around the wellbore is defined, including the undisturbed temperature profile, the pore pressure, the fracture pressure, the rock information, etc. Second, the wellbore is defined, including the casing and tubing definitions, the fluids in the tubing and annulus, cements, the wellpath, packer depth, and packer types. Third, the operation details are defined, including the type of operation (e.g., fracturing, injection, production, or circulation, etc.), fluid types, operation details (e.g., operation depth including operation above the end of string, flowrate, inlet temperatures, duration, etc.), flow path (e.g., through tubing or annulus, if circulation-forward circulation or reverse circulation), simulation conditions (e.g., transient or steady state, operation link), load types, and linking temperature and pressure source for stress calculations, etc.

In certain illustrative embodiments, thermal and stress simulation system 200 also prepares the input file to the calculation modules of thermal and stress simulator 210 in a formatted form, such that analysis and calculation is most efficient. The output of thermal and stress simulation system 200 may take a variety of forms. For example, the output may be in the form of a display or printed report such as plots, spreadsheets, or graphics. The reports may include, for example, data related to temperature and pressure profile results, fluid properties (e.g., density, viscosity, liquid hold up, flow regime, etc.), load, stress, safety factors (e.g., axial, triaxial, collapse, burst), displacement, movement, trapped annular pressure buildup, annular fluid expansion, etc.

The various calculation modules of thermal and stress simulator 210 perform a variety of functions. Such functions include reading and processing formatted input files prepared by thermal and stress simulation system 200. The calculations performed by modules 212, 214, 216, 218, 222, and 220 are numerous. First, thermal responses of the simulated wellbore may be calculated, including the heat transfer and fluid flows of the selected operations with the specified formation and wellbore configurations. In addition, other heat transfer and fluid flow related data may be calculated, including the simulated conditions (e.g., transient or steady state), fluid types, operation depth (including depth above the end of string), flowrate, inlet temperature, duration, flow direction (e.g., injection, production, forward circulation or reverse circulation), reference pressure and location (at wellhead or at perforation) of heat transfer and/or fluid flows, etc.

Other functions provided by the calculation modules of thermal and stress simulator 210 include stress analysis. Here, one or more of modules 212, 214, 216, 218, 222, and 220 compute, for example, the loads associated with the wellbore configuration defined via the GUI (e.g., display 208), the mechanical properties of the casing and tubing, the internal and external pressure and temperature (based upon the thermal analysis), load type (e.g., over-pull, pressure test, running in hole, tubing evacuation, etc.), the combined loads of internal and external density/pressure and associated temperature (calculated based upon the thermal and flow analysis), etc.

The thermal and stress analysis is then applied by thermal and stress simulator 210 to perform an overall wellbore system analysis. Here, based upon the thermal and stress analysis of one or more of modules 212, 214, 216, 218, 220, and 222, simulator 210 calculates the resulting effects on the various annular contents, initial and final conditions (e.g., temperature and pressure change), load history, wellhead installation and load configuration, etc. to thereby provide an output analysis used to plan, conduct, or review a given wellbore operation. The above calculations may be performed by one or more of modules 212, 214, 216, 218, 222, and 220.

As described above, the output of thermal and stress simulation system 200 may be displayed to a user via a GUI (e.g., display 208) in the form of a plot, spreadsheet, graphics, etc. The thermal analysis data may include a wellbore temperature profile (e.g., tubing, casing, fluid, and cement profiles), fluid pressure profile, near wellbore formation temperature profile, temperature and pressure change as a function of time, fluid velocity, fluid properties (e.g., density, viscosity, liquid hold up, flow regime, etc.), steam quality (if steam is used), etc. The stress analysis data may include initial and final temperature and axial load change conditions, safety factors (e.g., axial, tri-axial, burst, collapse, envelop), design limits, displacement and length change, packer load schematics, minimum safety factors, etc. The wellbore system analysis may include trapped annular fluid expansion ("AFE"), trapped annular pressure buildup ("APB"), wellhead movement, wellhead contact load, and the impact of APB on the stress analysis (e.g., safety factors, stress, length change, string displacement, design limits, etc.).

Figure 3A:
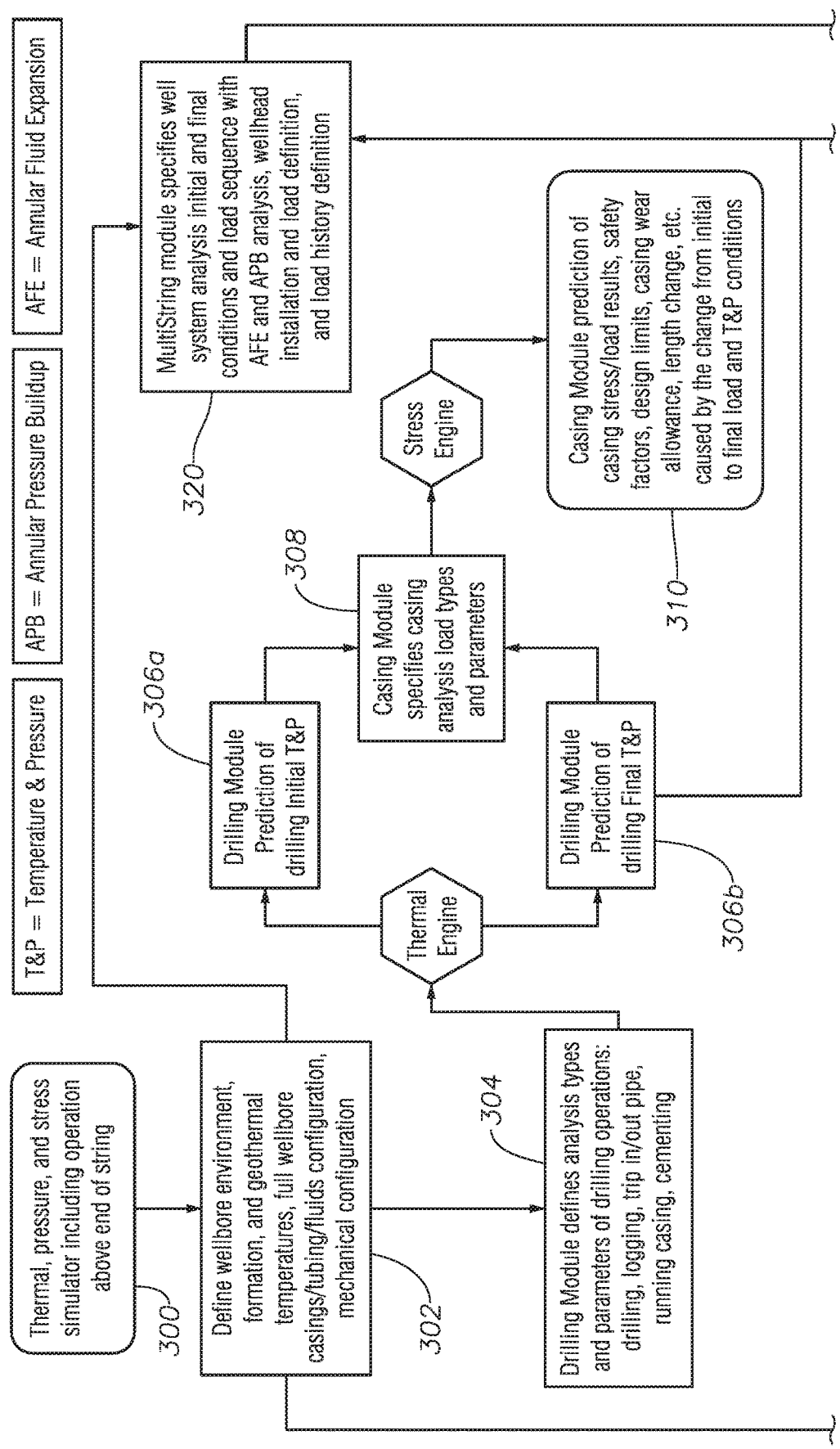
FIGS. 3A and 3B illustrate the data flow of thermal and stress simulation system 200 according to an illustrative method of the present disclosure.
Figure 3B:
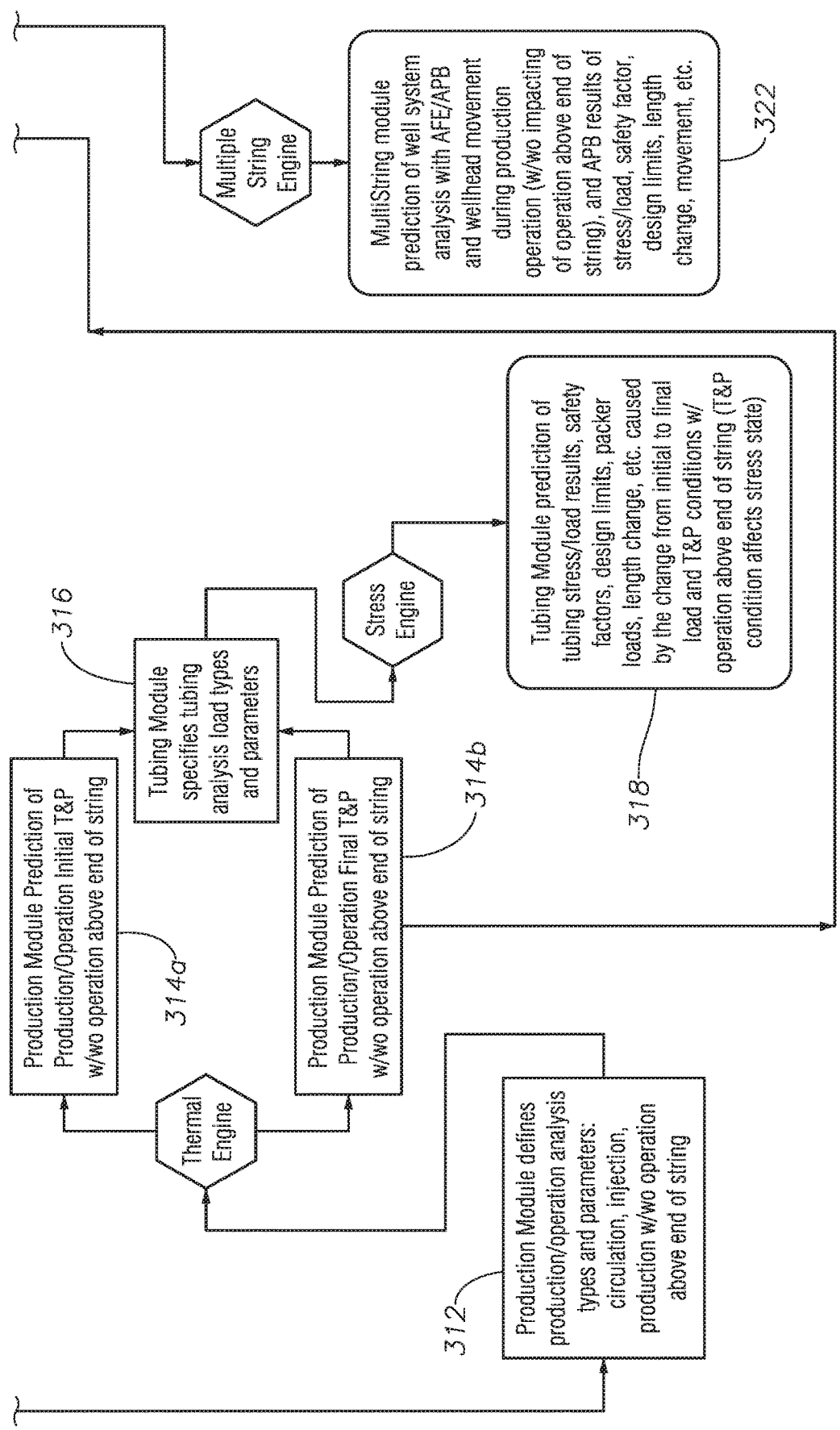

FIGS. 3A and 3B illustrate the data flow of thermal and stress simulation system 200 according to an illustrative method of the present disclosure. At block 300, thermal and stress simulation system 200 is powered to begin thermal, pressure, and stress simulations of wellbore operations above the end of the string. At block 302, the mechanical configuration of the well is defined using manual or automated means. For example, a user may input the well variables via I/O device 206 and display 208. However, the variables may also be received via network communication module 205 or called from memory by processor 202. In this illustrative embodiment, the input variables define the well configuration such as, for example, number of strings, casing and hole dimensions, fluids behind each string, cement types, and undisturbed static formation and geothermal temperatures.

At block 304, via the GUI, the analysis types and parameters of drilling operations are defined (e.g., by a user). The drilling operations may be defined as, for example, drilling, logging, trip in/out pipe, running casing, or cementing, whereby the resulting data is communicated to the thermal engine of drilling prediction module 212. Based upon these input variables, at block 306a, using drilling prediction module 212, processor 202 models the initial temperature and pressure conditions present during drilling, logging, trip pipe, casing, and cementing operations. At block 306b, drilling prediction module 212 models the "final" temperature and pressure conditions during the same operations. Note the term "final" may refer to the current drilling temperature and pressure of the wellbore if the present disclosure is being utilized to analyze the wellbore in real time. If this is the case, the "final" temperature and pressure will be the current temperature and pressure of the wellbore during that particular stage of downhole operation sought to be simulated. Moreover, the present disclosure could be utilized to model a certain stage of the drilling or other operation. If so, the selected operational stage would dictate the "final" temperature and pressure.

At block 308, via the GUI, casing analysis load types and parameters are defined, and the resulting data is communicated to casing stress module 216. The initial and final drilling temperature and pressure values are then fed into the stress engine of casing stress module 216, where processor 202 simulates the stresses on the casing strings caused by changes from the initial to final loads, as well as the temperature and pressure conditions affecting those casing strings, at block 310. Casing stress module 216 further simulates the effects on safety factors, design limits, casing wear allowance, length change, etc., caused by the change from the initial to final loads and temperature and pressure conditions.

Still referring to the illustrative method of FIGS. 3A and 3B, back at block 302, various wellbore parameters have been defined. At block 312, the wellbore parameters are fed into production prediction module 214, whereby various production related parameters are defined via the GUI. The production related parameters may include, for example, production/operation analysis types and parameters, including circulation, injection, and production with and without an operation above the end of the string. The thermal and pressure related effects along the string are simulated for all operation conditions with above and below the end of the string.

The variables defined at block 312 are then communicated to the thermal engine of production prediction module 214 at blocks 314a and 314b. At block 314a, production prediction module 214 simulates the initial production temperature and pressure conditions with and without operations above the end of the string. Such operations may include, for example, circulation, production, and injection operations. At block 314b, production prediction module 214 simulates the final production temperature and pressure conditions with and without operations above the end of the string.

The final production temperature and pressure is then fed into tubing stress module 218, where the tubing analysis load types and parameters are defined at block 316. The resulting data is then communicated to the stress engine of tubing stress module 218 at block 318. Here, processor 202 simulates the tubing stresses caused by changes from the initial to final loads, as well as the temperature and pressure conditions (with or without operations above the end of the string) affecting the stress state of the tubing.

Back at block 302, after the wellbore parameters are defined therein, the resulting data is communicated to multistring module 220 at block 320. Also, at block 306b, after the final temperature and pressure has been simulated by drilling prediction module 212, the resulting data is also communicated to multistring module 220 at block 320. In addition, after the final temperature and pressure (with or without operations above the end of the string) have simulated by production prediction module 214 at block 314b, the resulting data is communicated to multistring module 220 at block 320.

At block 320, via the GUI, the well system analysis initial and final conditions and load sequence are defined, along with the annular fluid expansion and annular pressure buildup analysis. In addition, the wellhead installation and loads are defined, along with the load history. At block 322, all the resulting data is then fed into the multiple string engine of multistring module 220, whereby the final (or most current) well system analysis and simulation is performed by processor 202 in order to determine the annular fluid expansion (i.e., trapped annular pressure buildup) and wellhead movement over the life of the wellbore. Here, multistring module performs analysis of the well system with annular fluid expansion/annular pressure buildup and wellhead movement during production operations (with or without the impact of operations above the end of the string), and annular pressure buildup results of stresses/loads, safety factor, design limits, length change, movement, etc. Accordingly, the outputs of the simulation may then be used to plan, conduct, or analyze a wellbore operation.

In view of the foregoing, the illustrative methods and embodiments described herein provide integrated methods to perform thermal and stress calculations for operations above the end of an operating string, to thereby meet analysis needs in the field. In certain illustrative embodiments, in the operation details dialog of the GUI, the operation depth (e.g., perforation depth for the injection operation, circulation depth for the circulation operation, etc.) may be defined as anywhere above the end of string. When an above end of string operation is defined, the system assumes there is a plug 30 (FIG. 1B) placed just below the operation depth in the operation string. However, no packer is automatically assumed in the annulus, and in certain embodiments all the packers are required to be user-specified for the calculation.

Figure 4:
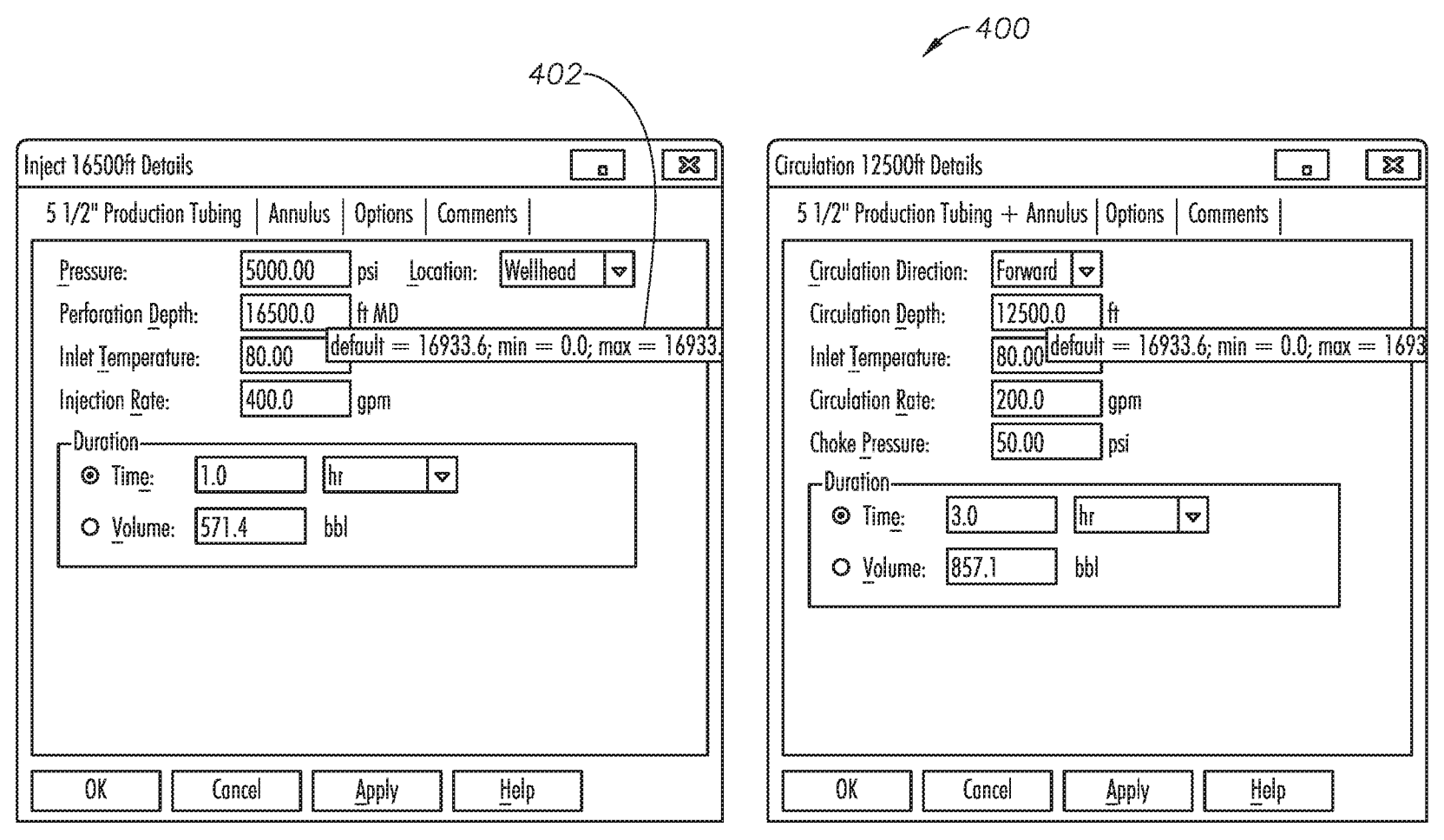

FIG. 4 illustrates a user interface (GUI) 400 used to define thermal and stress related parameters, according to certain illustrative embodiments of the present disclosure. As can be seen, the operation detail dialogs are illustrated for an injection (left) and circulation (right) operation. In the injection dialog box, the pressures and associated locations are defined, along with the perforation depth, inlet temperature and injection rate. In addition, the duration and volume of the injection operation are also defined. Note also dialog box 402 sets the perforation depth by default to the end of the string (in this example the end of the string is 16933.0 feet). Therefore, in this example, the user has selected a perforation depth above the end of the string at 16500.0 ft. In the circulation dialog box, the circulation direction and depth are defined. The inlet temperature, circulation rate, and choke pressure are also defined. The duration (time and volume) are then defined. Note, again, the circulation depth by default is 16933.0 (the end of the string). Thus, in this example as well, the user has specified the circulation depth to 12500 (above the end of the string).

In certain illustrative embodiments, the simulated plugs in the operation string and packers in the annulus play the role of pressure and flowing barriers. When an operation is performed above the end of string, the calculation is processed by the system in two parts: a fluid flowing portion above the operation depth (i.e., above the end of operating string, and a fluid static portion below the operation depth (i.e., below the end of operating string. Above the operation depth, the fluid flow highly impacts the temperature with dominantly forced convection heat transfer effects and, as a result, impacts the pressure due to a flowing friction pressure drop. Below the operation depth, the temperature and pressure are calculated based on the hydrostatic status where the heat transfer is dominantly based on conduction and natural convection. Below the current plug, there may exist other plugs from historical operations, resulting in multiple no-flow regions. Certain illustrative embodiments of the present disclosure consider all the differences in the calculation.

Figure 5:
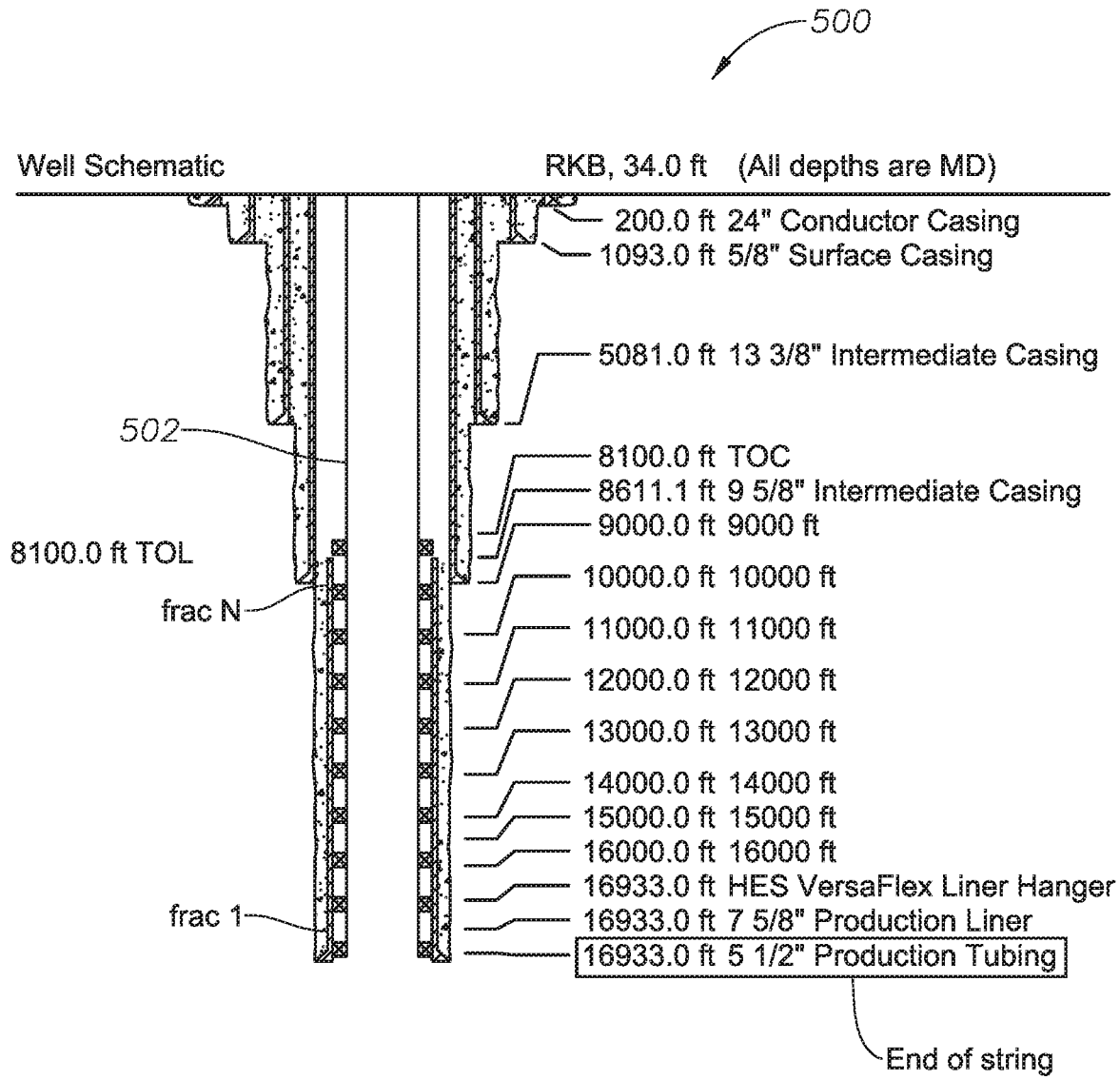
FIG. 5 illustrates a screen shot showing a horizontal well schematic 500 defined utilizing an illustrative embodiment of the present disclosure.
Figure 6:
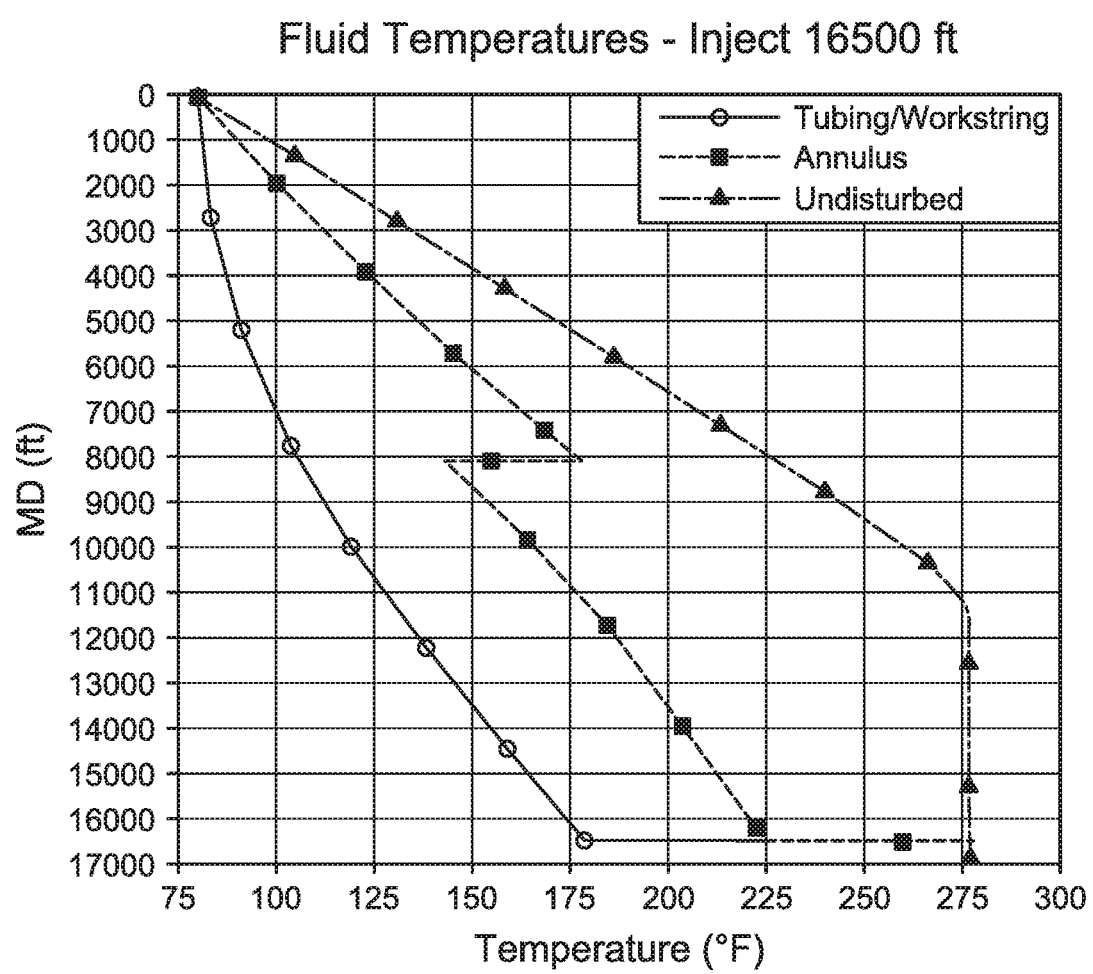
FIG. 6 plots the temperature output of the above end of string operation of FIG. 5 for a single injection operation.
Figure 7:
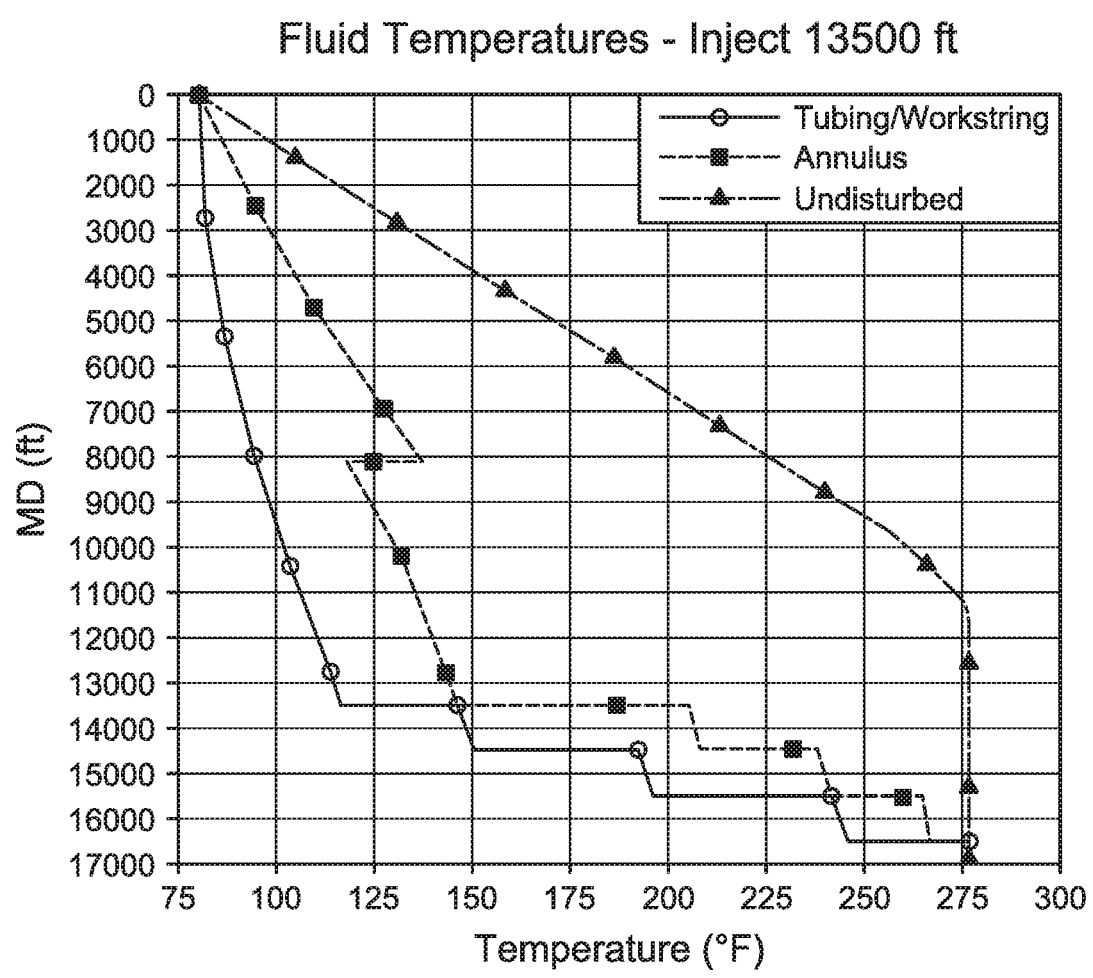
FIG. 7 illustrates the temperature profile for a linked injection operation above the end of the string (after a sequence of above the end of string operations chain)
Figure 8:
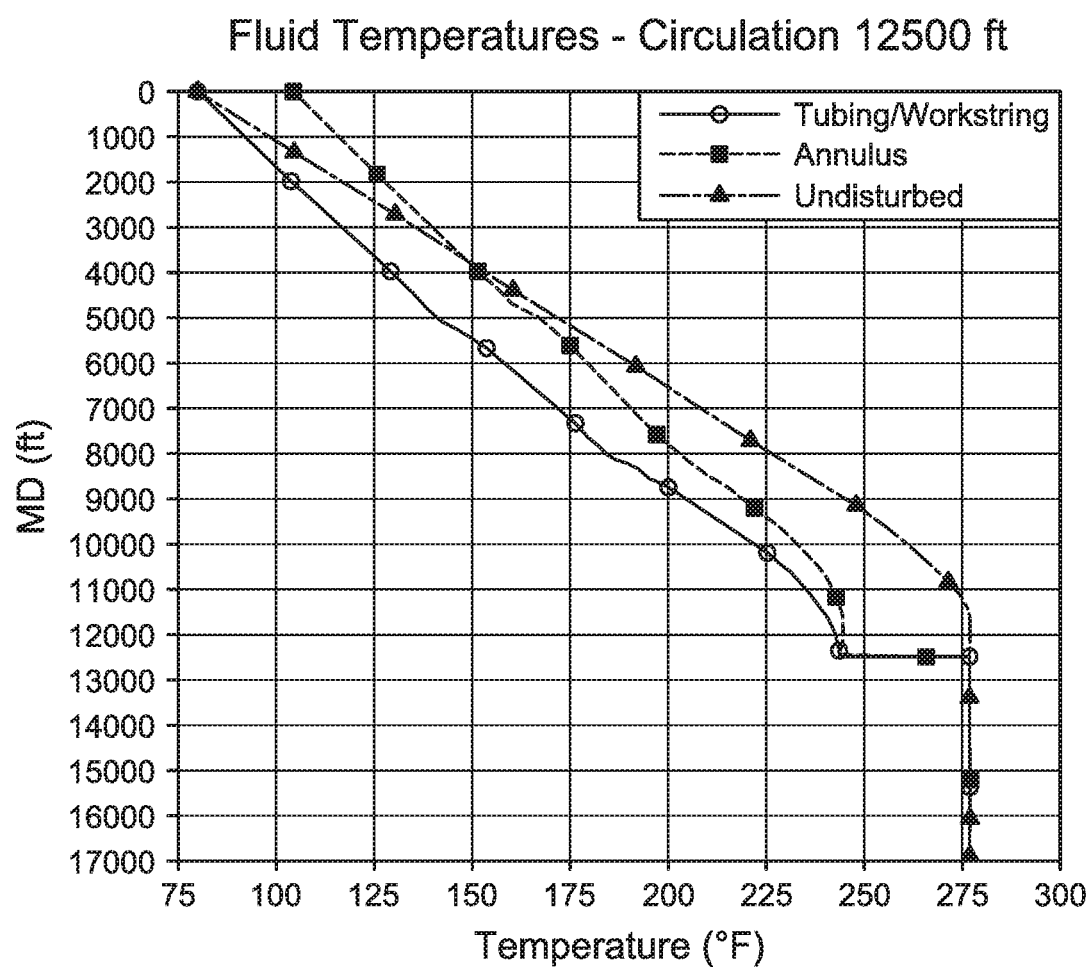
FIG. 8 illustrates a temperature profile for a circulation operation above the end of the string.
Figure 9:
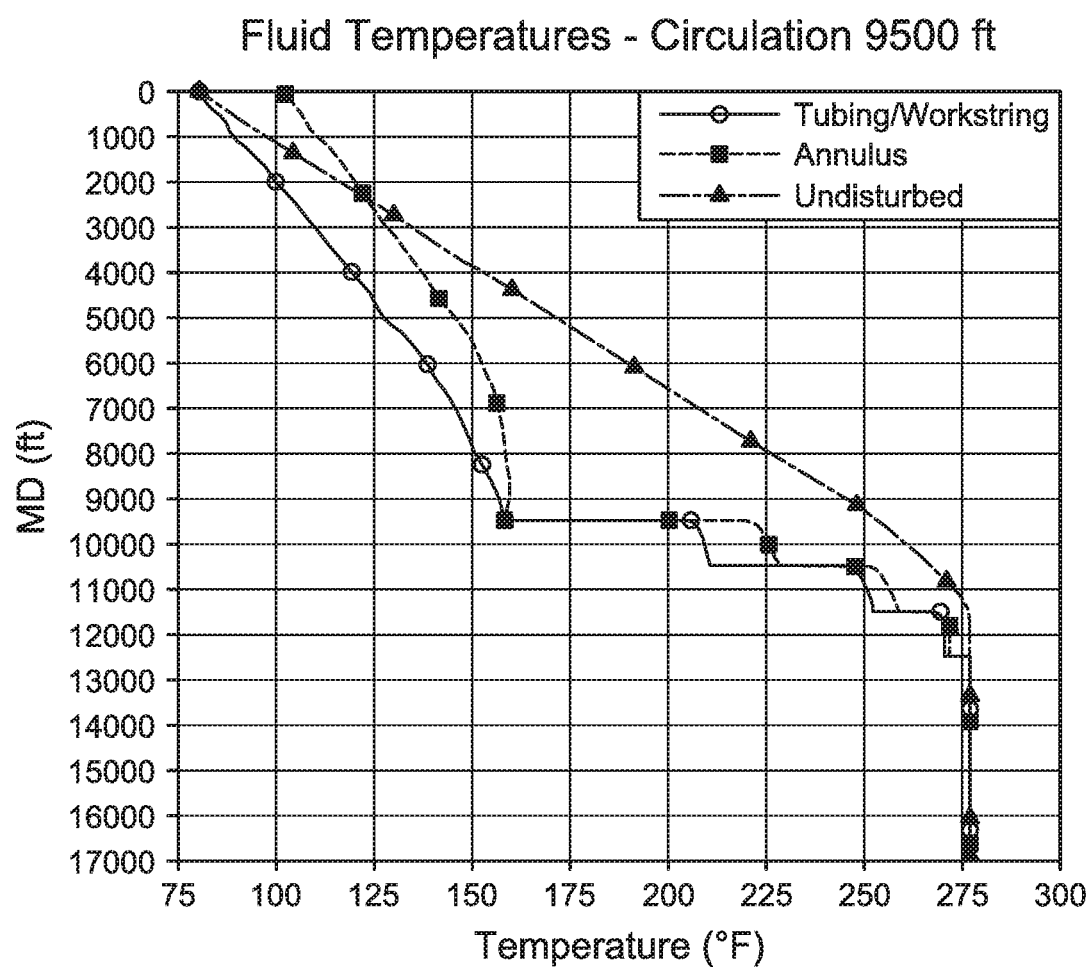
FIG. 9 illustrates a temperature profile for a linked circulation operation above the end of the string (after a sequence of above the end of string operations chain)

FIG. 5 illustrates a screen shot showing a well schematic 500 defined utilizing an illustrative embodiment of the present disclosure. Note the end of operation string is identified at the bottom of the wellbore 500. The well configuration includes a series of fracture zones 1-N. For illustration purposes, the temperature output of the above end of string operation of FIG. 5 (tubing 502 is used and shown in this illustration) is illustrated for a single injection operation in FIG. 6. Here, the measured depth (ft) is shown relative to fluid temperatures (for tubing/workstring, annulus and undisturbed) above the end of the string during an injection operation. FIG. 7 illustrates the temperature profile for a linked injection operation above the end of the string after a sequence of above the end of the string operations chain; FIG. 8 illustrates a temperature profile for a circulation operation above the end of the string; and FIG. 9 illustrates a temperature profile for a linked circulation operation above the end of the string after a sequence of above the end of the string operations chain. A linked operation refers to one in which the resultant wellbore temperature/pressure of a prior operation is applied as an initial wellbore temperature, and so forth.

Figure 10:
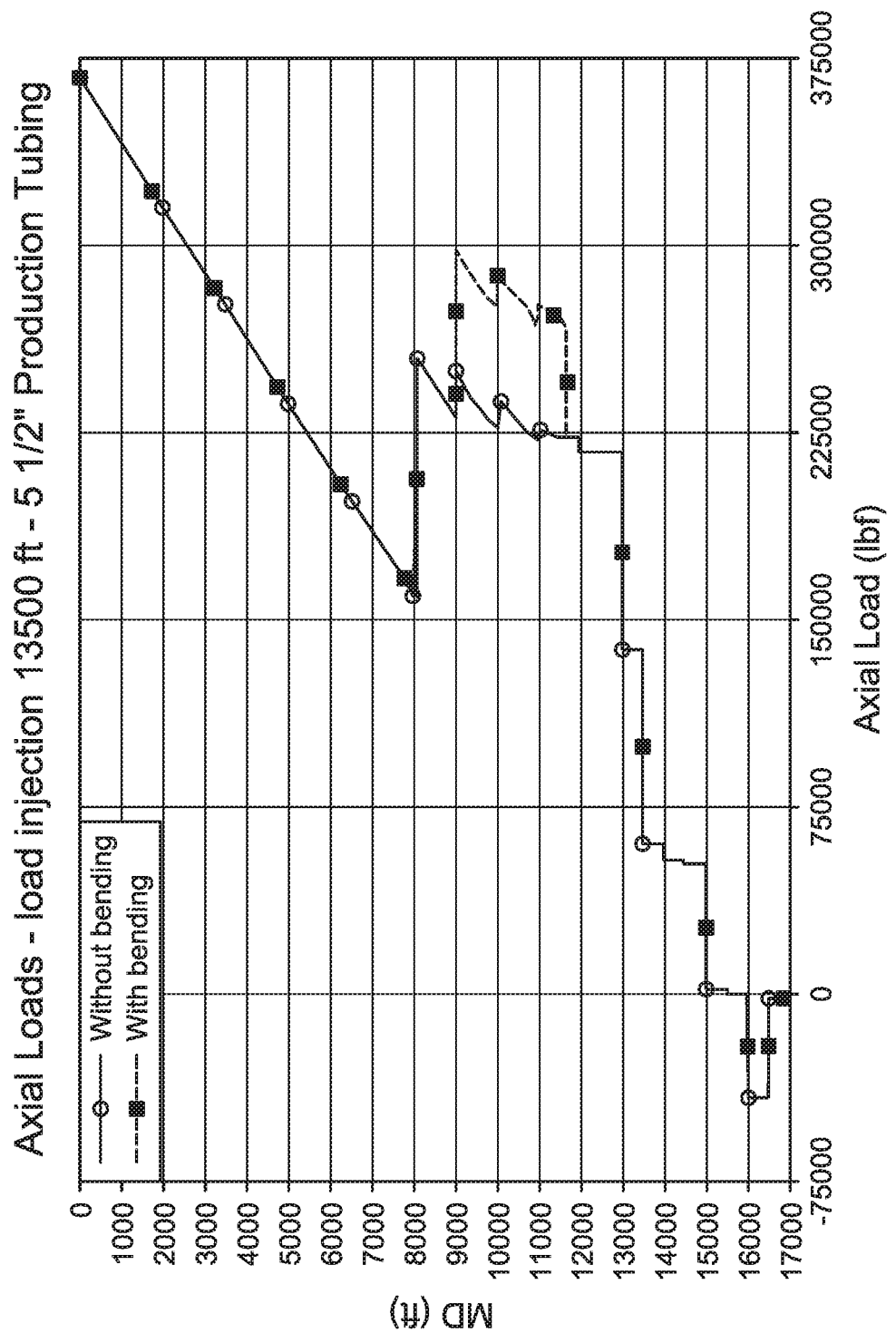
FIG. 10 plots the axial load of a linked operation above the end of a string (after a sequence of above the end of string operations chain)
Figure 11:
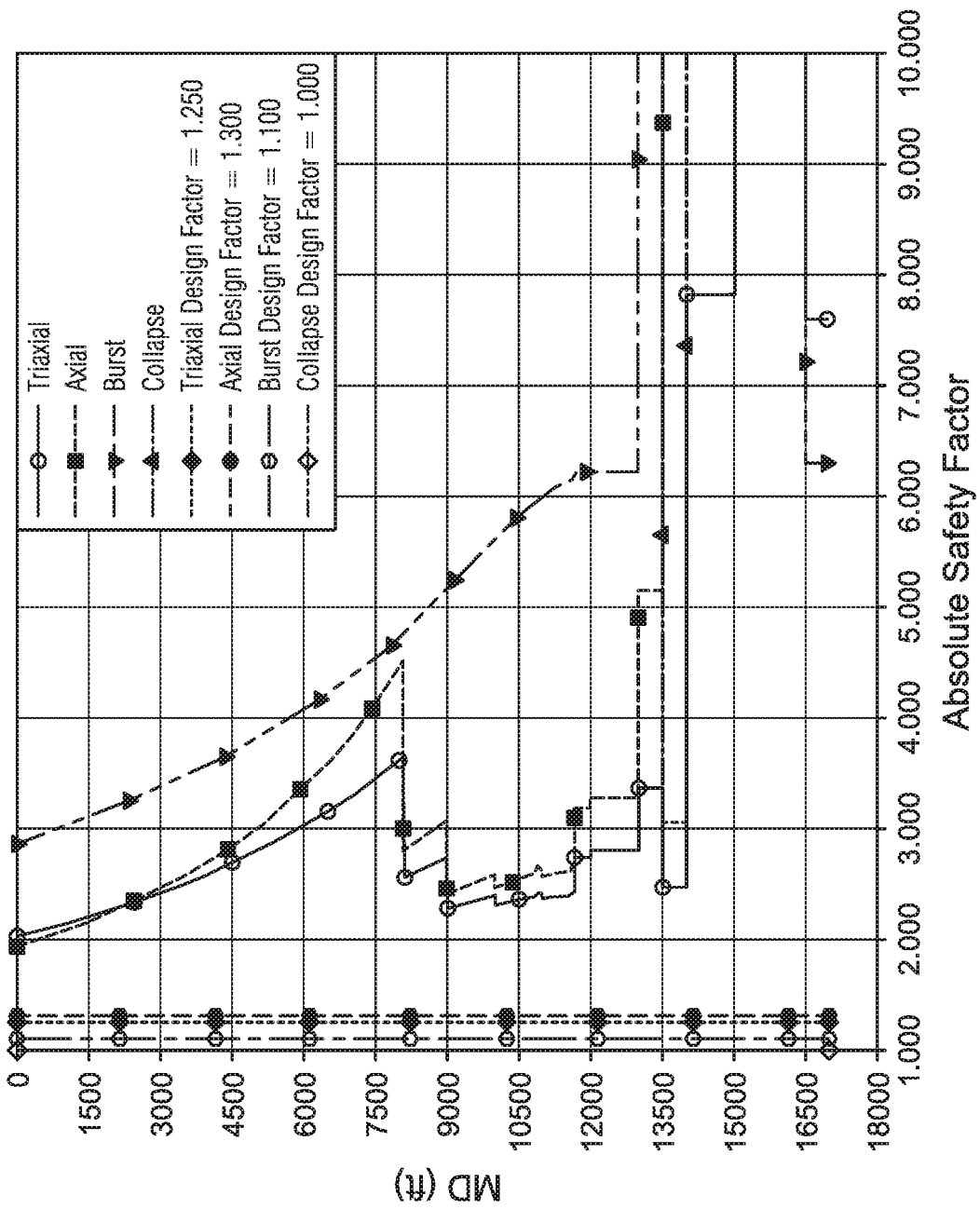
FIG. 11 plots the safety factors of a linked operation above the end of string (after a sequence of above the end of string operations chain)
Figure 12:
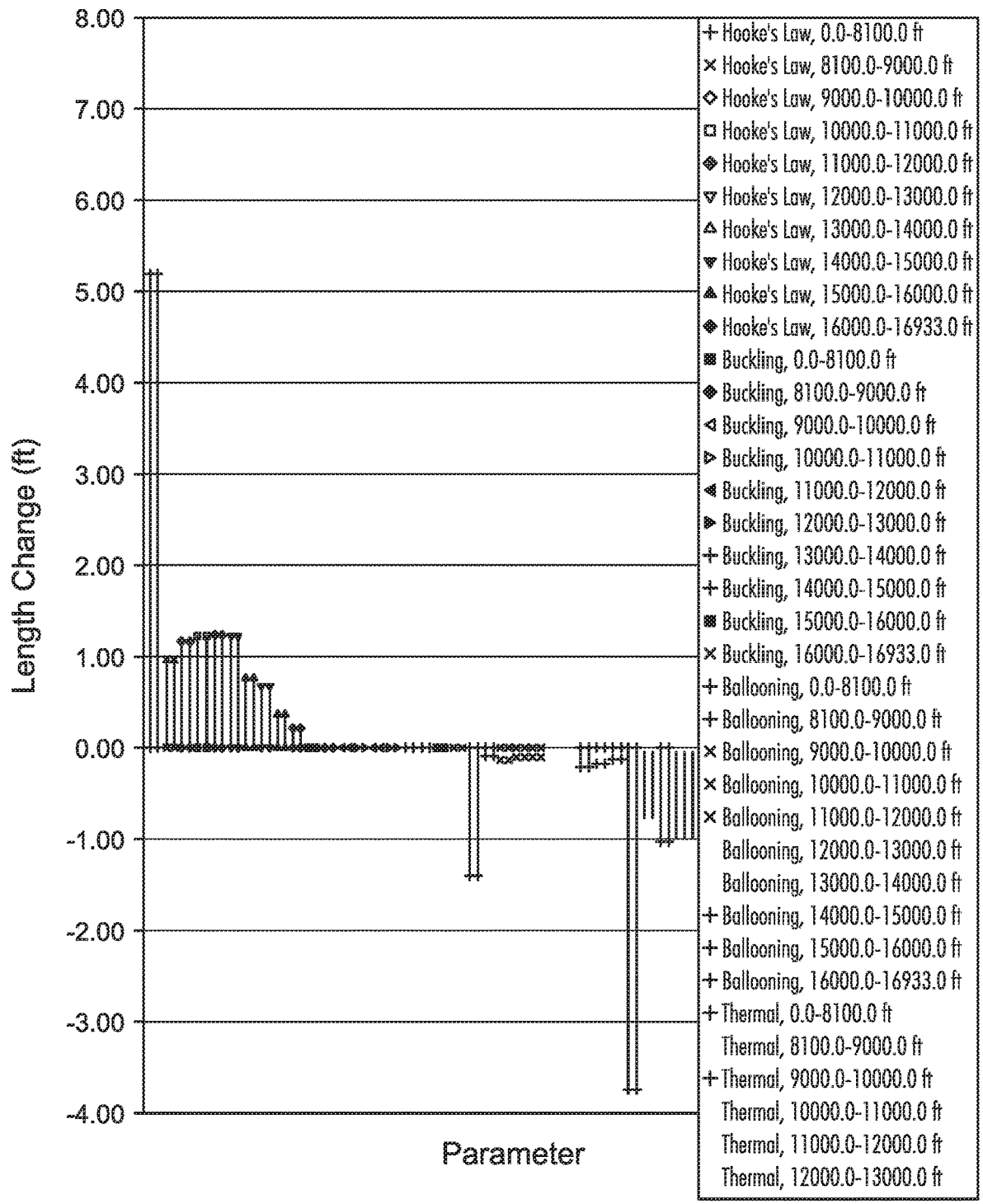
FIG. 12 plots the length change results of a linked operation above the end of string (after a sequence of above the end of string operations chain)

Still referencing FIGS. 4-9, once the thermal results have been obtained by the system, the workflow process continues via the casing and tubing stress modules for stress analysis, whereby production module temperature and pressure results are applied for the casing and tubing stress analysis. This process will include the operation temperature and pressure generated in simulating such an above end of string operation. As previously mentioned, the presence of the plug and packers results in pressure discontinuity over the plug, and results in stress discontinuity along the casing and tubing, which may result in the failure of the casing and tubing. The stress analysis modules of the present disclosure, however, calculates these stress results, thereby enabling prevention and correction of such instances. The stress results may include axial loads, safety factors (e.g., axial, triaxial, collapse, burst safety factor), tubing and casing length change, and displacement, packer load analysis, etc. as illustrated in FIGS. 10-12. FIG. 10 plots the axial load of a linked operation above the end of a string (with and without bending) after a sequence of above the end of the string operations chain; FIG. 11 plots the safety factors of such a linked operation above the end of string after a sequence of above the end of the string operations chain; and FIG. 12 plots the length change results of a linked operation above the end of string after a sequence of above the end of the string operations chain.

Figure 13:
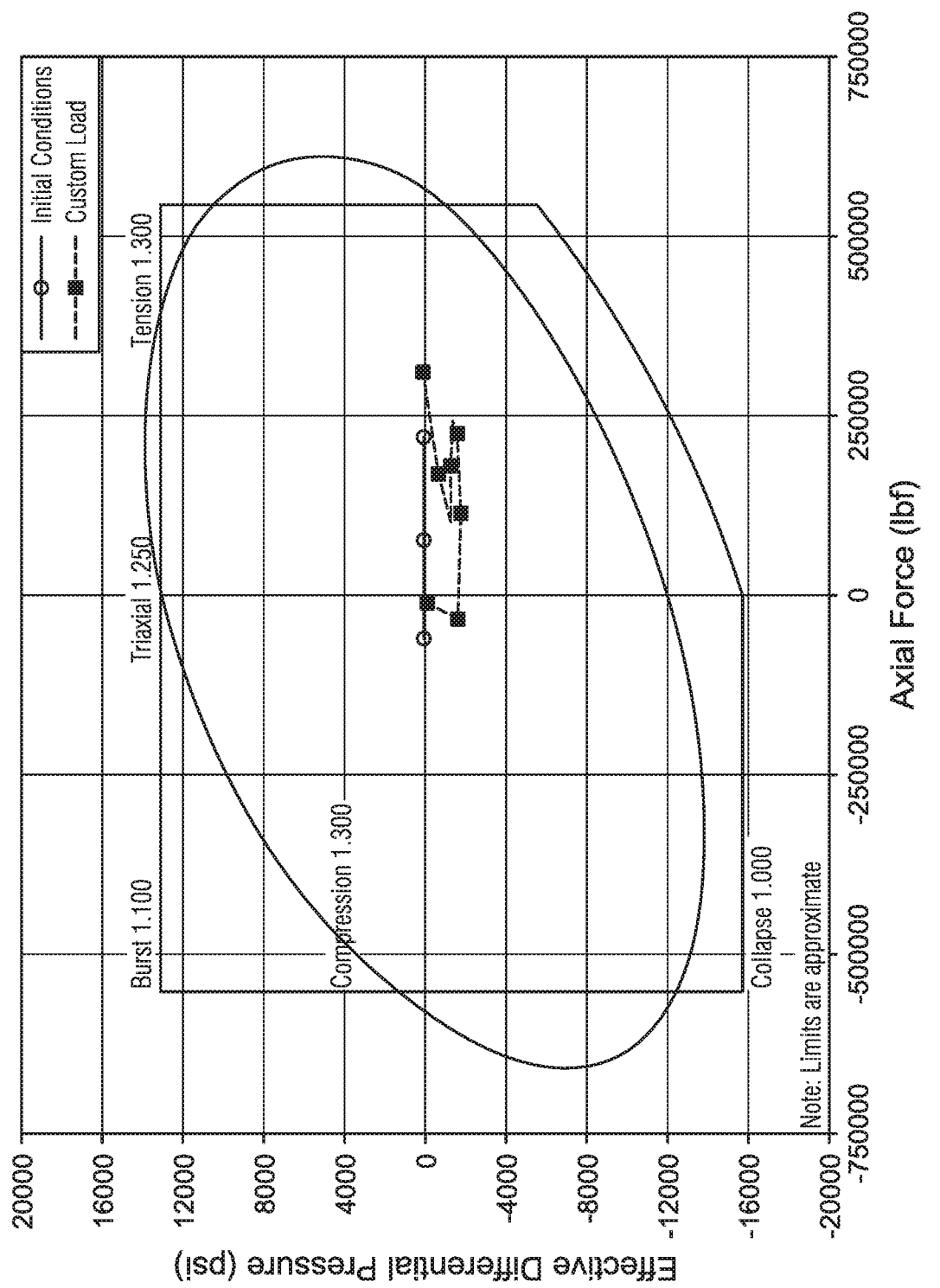
FIG. 13 plots the design limit for the tubing with the temperature and pressure associated with a sequential linked above end of string operation.

FIG. 13 plots the design limit for the tubing with the temperature and pressure associated with a sequential linked above end of string operation. In FIG. 13, the plot shows the results of the last operation with injection at 13500 feet. Accordingly, a suitable tubing design may be applied to avoid the limit or, in the alternative, the same tubing may be used while avoiding the design limit.

Finally the illustrated workflow of FIGS. 4-13 applies the operation results, including the impact of such above end of string operation temperature and pressure profiles, to the multistring trapped annular pressure buildup and wellhead movement analysis previously described. Because the temperature response above and below the operation depth (i.e., injection depth, or fracturing depth, or circulation depth) is different, and there are large deviations over the plugs and packers, it is expected the trapped annular pressure will be quite different; and it is also expected at different trapped annulus regions, some regions may have pressure increases while some may have pressure decreases. The deviating annular pressure buildup at different regions condition induces additional load discontinuity on the tubing and casings and may induce further string failure, all to be discovered using the illustrative methods described herein.

Accordingly, the methods described herein provide integrated workflows and systems to analyze thermal and stress conditions during complex above end of string operations, thereby meeting industry needs. To date, the conventional approaches have been limited to below the end of string analysis. The illustrative methods described herein simulates the wellbore thermal responses of above end of string operations (e.g., fracturing, injection, circulation, production), then applies the temperature and densities/pressures to the stress analysis of tubing, and finally shares the well system temperatures and flow data of densities and pressures with a well system wellbore complex loading simulator to thereby calculate trap annular pressure and wellhead movement affected by such special operational sequences.

Methods and embodiments described herein further relate to any one or more of the following paragraphs:

1. A computer-implemented method to simulate thermal and stress conditions of a wellbore above an end of an operating string, the method comprising defining a configuration of a wellbore having an operating string therein; defining an operation to be performed along the wellbore above an end of the operating string; and based upon the wellbore configuration and operation to be performed, calculating a thermal and stress response of the wellbore above the end of the operating string.

2. A computer-implemented method as defined in paragraph 1, further comprising calculating a trapped annular pressure buildup of the wellbore based upon the thermal and stress responses.

3. A computer-implemented method as defined in paragraphs 1 or 2, further comprising calculating wellhead movement of the wellbore based upon the thermal and stress responses.

4. A computer-implemented method as defined in any of paragraphs 1-3, wherein the operation is a fracturing, injection, production, or circulation operation.

5. A computer-implemented method as defined in any of paragraphs 1-4, wherein the thermal and stress response of the wellbore above the end of the operating string are calculated by determining fluid flow above the end of the operating string; and determining a static behavior of fluid below the end of the operating string.

6. A computer-implemented method as defined in any of paragraphs 1-5, wherein defining the operation comprises defining a measured depth for the operation along the wellbore; defining a position of a plug within the operating string beneath the measured depth; and defining a position of a packer along an annulus of the wellbore.

7. A computer-implemented method as defined in any of paragraphs 1-6, wherein the simulation is applied to plan, conduct, or analyze a wellbore operation.

8. A system to simulate thermal and stress conditions of a wellbore above an end of an operating string, the system comprising a user interface; and processing circuitry communicably coupled to the user interface and configured to execute instructions to cause the system to perform operations comprising defining a configuration of a wellbore having an operating string therein; defining an operation to be performed along the wellbore above an end of the operating string; and based upon the wellbore configuration and operation to be performed, calculating a thermal and stress response of the wellbore above the end of the operating string.

9. A system as defined in paragraph 8, further comprising calculating a trapped annular pressure buildup of the wellbore based upon the thermal and stress responses.

10. A system as defined in paragraphs 8 or 9, further comprising calculating wellhead movement of the wellbore based upon the thermal and stress responses.

11. A system as defined in any of paragraphs 8-10, wherein the operation is a fracturing, injection, production, or circulation operation.

12. A system as defined in any of paragraphs 8-11, wherein the thermal and stress response of the wellbore above the end of the operating string are calculated by determining fluid flow above the end of the operating string; and determining a static behavior of fluid below the end of the operating string.

13. A system as defined in any of paragraphs 8-12, wherein defining the operation comprises defining a measured depth for the operation along the wellbore; defining a position of a plug within the operating string beneath the measured depth; and defining a position of a packer along an annulus of the wellbore.

14. A system as defined in any of paragraphs 8-13, wherein the simulation is applied to plan, conduct, or analyze a wellbore operation.

Furthermore, the illustrative methods described herein may be implemented by a system comprising processing circuitry or a non-transitory computer readable medium comprising instructions which, when executed by at least one processor, causes the processor to perform any of the methods described herein.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A computer-implemented method to simulate thermal and stress conditions of a wellbore above an end of an operating string, the method comprising:
   defining, using a thermal and stress simulation system, a configuration of a wellbore having an operating string therein;
   defining, using the thermal and stress simulation system, a hydraulic fracture operation to be performed along the wellbore above an end of the operating string, wherein the hydraulic fracture operation comprises a series of linked operations in which a result of a prior linked operation is applied as an initial condition of a next linked operation, wherein defining a hydraulic fracture operation includes selecting a perforation depth; and
   using the thermal and stress simulation system and based upon the wellbore configuration and operation to be performed, calculating a thermal and stress response of the wellbore above the end of the operating string by:
      calculating forced convection heat transfer effects on temperature and pressure caused by fluid flow above the end of the operating string; and
      calculating natural convection heat transfer effects on temperature and pressure caused by non-flowing fluid below the end of the operating string.

2. A computer-implemented method as defined in claim 1, further comprising calculating a trapped annular pressure buildup of the wellbore based upon the thermal and stress responses.

3. A computer-implemented method as defined in claim 1, further comprising calculating wellhead movement of the wellbore based upon the thermal and stress responses.

4. A computer-implemented method as defined in claim 1, wherein defining the operation comprises:
   defining a measured depth for the operation along the wellbore;
   defining a position of a plug within the operating string beneath the measured depth; and
   defining a position of a packer along an annulus of the wellbore.

5. A computer-implemented method as defined in claim 1, wherein the simulation is applied to plan, conduct, or analyze a wellbore operation.

6. A system to simulate thermal and stress conditions of a wellbore above an end of an operating string, the system comprising:
   a user interface; and
   processing circuitry communicably coupled to the user interface and configured to execute instructions to cause the system to perform operations comprising:
      defining a configuration of a wellbore having an operating string therein;
      defining a hydraulic fracture operation to be performed along the wellbore above an end of the operating string, wherein the hydraulic fracture operation comprises a series of linked operations in which a result of a prior linked operation is applied as an initial condition of a next linked operation, and
      wherein defining a hydraulic fracture operation includes selecting a perforation depth; and based upon the wellbore configuration and operation to be performed, calculating a thermal and stress response of the wellbore above the end of the operating string by:
         calculating forced convection heat transfer effects on temperature and pressure caused by fluid flow above the end of the operating string; and
         calculating natural convection heat transfer effects on temperature and pressure caused by non-flowing fluid below the end of the operating string.

7. A system as defined in claim 6, further comprising calculating a trapped annular pressure buildup of the wellbore based upon the thermal and stress responses.

8. A system as defined in claim 6, further comprising calculating wellhead movement of the wellbore based upon the thermal and stress responses.

9. A system as defined in claim 6, wherein defining the operation comprises:
   defining a measured depth for the operation along the wellbore;
   defining a position of a plug within the operating string beneath the measured depth; and
   defining a position of a packer along an annulus of the wellbore.

10. A system as defined in claim 6, wherein the simulation is applied to plan, conduct, or analyze a wellbore operation.

11. A non-transitory computer readable medium comprising instructions which, when executed by at least one processor, causes the processor to perform a method comprising the method of claim 1.

* * * * *